United States Patent [19]

Kenney

[11] Patent Number: 5,001,525
[45] Date of Patent: Mar. 19, 1991

[54] TWO SQUARE MEMORY CELLS HAVING HIGHLY CONDUCTIVE WORD LINES

[75] Inventor: Donald M. Kenney, Shelburne, Vt.

[73] Assignee: International Business Machines Corporation, Armonk, N.Y.

[21] Appl. No.: 329,130

[22] Filed: Mar. 27, 1989

[51] Int. Cl.⁵ ...................... H01L 29/78; G11C 11/34
[52] U.S. Cl. .................................. 357/23.6; 357/23.1; 365/182
[58] Field of Search ............... 357/23.6, 23.7; 365/182

[56] References Cited

U.S. PATENT DOCUMENTS

| | | | |
|---|---|---|---|
| 3,387,286 | 6/1968 | Dennard | 340/173 |
| 3,811,076 | 5/1974 | Smith, Jr. | 317/235 R |
| 3,841,926 | 10/1974 | Garnache et al. | 148/188 |
| 4,225,945 | 9/1980 | Kuo | 365/149 |
| 4,271,418 | 6/1981 | Hiltpold | 357/23 |
| 4,295,924 | 10/1981 | Garnache et al. | 156/643 |
| 4,327,476 | 5/1982 | Iwai et al. | 29/571 |
| 4,335,450 | 6/1982 | Thomas | 365/182 |
| 4,462,040 | 7/1984 | Ho et al. | 357/23 |
| 4,673,962 | 6/1987 | Chatterjee et al. | 357/23.6 |
| 4,769,786 | 9/1988 | Garnache et al. | 365/182 |
| 4,785,337 | 11/1988 | Kenney | 357/23.6 |
| 4,811,067 | 5/1989 | Fitzgerald et al. | 357/236 |
| 4,864,375 | 9/1989 | Teng et al. | 37/23.6 |

OTHER PUBLICATIONS

IBM Tech. Discl., vol. 31, #7, Dec. 88, pp. 307–308.
IBM Technical Disclosure Bulletin, vol. 27, No. 2, Jul. 1984, pp. 1313–1320, "Compact One-Device Dynamic RAM Cell with High Storage Capacitance" by C. G. Jambotkar.

Primary Examiner—Jerome Jackson, Jr.
Assistant Examiner—Stephen D. Meier
Attorney, Agent, or Firm—Stephen J. Limanek

[57] ABSTRACT

A very small memory cell utilizing only two squares at a major surface is provided which includes a semiconductor substrate having a major surface and a trench disposed therein having a longitudinal axis, a storage capacitor having a storage node disposed within a given sidewall of the trench, a switching device coupled to the storage capacitor and having an elongated current carrying element disposed within the given sidewall with its longitudinal direction arranged parallel to that of the longitudinal axis of the trench and a control element disposed on the sidewall of the trench between the storage capacitor and the elongated current carrying element, and an electrically conductive line disposed on the major surface of the semiconductor substrate in a direction orthogonal to the longitudinal axis of the trench and in contact with the control element of the switching device. Furthermore, two complete memory cells are formed at each trench-word line intersection with one cell formed on each side of the trench at each intersection.

24 Claims, 3 Drawing Sheets

TWO SQUARE MEMORY CELLS HAVING HIGHLY CONDUCTIVE WORD LINES

TECHNICAL FIELD

This invention relates to integrated semiconductor memory circuits and more particularly to a memory with a very high density of cells, each of which employs means for storing a binary digit of information in a trench or groove formed in a semiconductor substrate.

BACKGROUND ART

Integrated semiconductor memory circuits, particularly those employing cells which include essentially a storage capacitor and a switch have achieved high memory cell densities. One of the simplest circuits for providing a small dynamic memory cell is described in commonly assigned U.S. Pat. No. 3,387,286, filed July 14, 1967, by R. H. Dennard. Each cell employs a storage capacitor and a field effect transistor acting as a switch to selectively connect the capacitor to a bit/sense line.

In also commonly assigned U.S. Pat. Nos. 3,811,076 by W. M. Smith, and 3,841,926 by R. R. Garnache and W. M. Smith, both filed on Jan. 2, 1973, there is disclosed a one device field effect transistor memory cell of the type described in the hereinabove identified Dennard patent which utilizes a layer of doped polysilicon and an N+ diffusion region in a P type conductivity semiconductor substrate separated by a dielectric medium disposed on the surface of the semiconductor substrate for forming the storage capacitor of the cell. The polysilicon layer extends beyond the storage capacitor to act as a field shield between adjacent cells by applying a negative bias or fixed negative potential to the polysilicon layer. The N+ diffusion region of the storage capacitor is formed by using a doped segment of an insulating layer disposed on the surface of the semiconductor substrate and outdiffusing the dopant into the substrate.

Although the cells described hereinabove do provide memories having a high density of cells in a planar or two dimensional arrangement, yet each cell does require a significant given area of semiconductor substrate surface. To reduce the size of the given surface area for each cell, structures have been made wherein a semiconductor device or a cell is formed in a three dimensional arrangement. In commonly assigned U.S. Pat. No. 4,295,924, filed on Dec. 17, 1979 by R. R. Garnache and D. M. Kenney, there is disclosed a semiconductor device located within a groove or trench with a self-aligned conductive layer formed on a wall of the trench either directly or on a supporting insulating layer as an element of the device. A memory cell formed in a groove or trench is described in commonly assigned U.S. Pat. No. 4,335,450, filed on Jan. 30, 1980, by D. R. Thomas, wherein there is disclosed a cell having a transistor disposed on a sidewall of a groove or trench with the storage node disposed below the transistor. Also U.S. Pat. No. 4,327,476, filed on Nov. 28, 1980, describes a vertical cell having the storage capacitor in a well or trench.

Furthermore, commonly assigned U.S. Pat. No. 4,462,040, filed on Mar. 30, 1980, by I. T. Ho and J. Riseman, discloses a one device dynamic random access memory utilizing a trench having vertical sidewalls with the storage capacitor and the transfer device located within the trench, and U.S. Pat. Nos. 4,271,418, filed on Oct. 29, 1979, and 4,225,945, filed on June 6, 1977, and commonly assigned U.S. patent application having Ser. No. 793,401, filed on Oct. 31, 1985, by D. M. Kenney, now U.S. Pat. No. 4,785,337, and IBM Technical Disclosure Bulletin, Vol. 27, No. 2, July 1984, pp. 1313 to 1320, by C. G. Jambotkar, teach a one device memory cell formed in a groove or trench with the storage node located at the bottom of the trench, the bit/sense line at the top of this structure and the transfer device on the sidewall of the trench.

Commonly assigned U.S. patent application having Ser. No. 858,787, filed on May 2, 1986, by B. F. Fitzgerald, K. Y. Nguyen and S. V. Nguyen, now U.S. Pat. No. 4,811,067, describes a dynamic memory cell wherein the switching device is located at the bottom of the trench, with the storage capacitor and the bit/sense line being formed along opposite sidewalls of the trench.

U.S. Pat. No. 4,673,962, filed Mar. 21, 1985, discloses a memory structure wherein a pair of cells are formed on a semiconductor substrate, each cell having a polysilicon storage node located on a sidewall of a trench opposite that of the other cell.

Commonly assigned U.S. Pat. No. 4,769,786, filed on July 15, 1986, by R. R. Garnache and D. M. Kenney, discloses a memory circuit wherein each of the memory cells requires only two lithographic squares of the surface of a semiconductor substrate, wherein one lithographic square is defined by the intersection of two orthogonally arranged lithographic lines, each line being of a given width, e.g., less than a micron, as used in forming elements of devices in integrated semiconductor circuits. In the memory circuit of this patent, two memory cells are formed at the intersection of a trench and a bit/sense line. In the hereinabove cited prior art, none of the references except for the commonly assigned U.S. Pat. No. 4,769,786 and the U.S. Pat. No. 4,673,962 disclose a very small memory cell which utilizes a semiconductor substrate surface area of less than four lithographic squares.

DISCLOSURE OF THE INVENTION

It is an object of this invention to provide a memory cell having a highly conductive word line and a bit/sense line with minimized capacitive coupling for an improved signal to noise ratio which occupies, along with necessary isolation means, only two lithographic squares of the surface of a semiconductor substrate and is made by simple processing techniques.

In accordance with the teachings of this invention, a memory is provided which includes a semiconductor substrate having a major surface and a trench disposed therein having a longitudinal axis, storage means having a storage node disposed within a given sidewall of the trench, switching means including an elongated current carrying element having a longitudinal direction parallel to the longitudinal axis of the trench and disposed within the given sidewall of the trench and a control element located between the storage means and the major surface of the substrate and coupled to the storage means, and an electrically conductive line disposed on the major surface of the semiconductor substrate in a direction orthogonal to the longitudinal axis of the trench in contact with the control element of the switching means.

In a particular embodiment of the present invention, a dynamic random access memory is provided which includes a semiconductor substrate having a major surface and a trench formed therein, a first storage capacitor having a storage node disposed within one sidewall of the trench, a second storage capacitor having a storage node disposed within a sidewall of the trench opposite that of the one sidewall, a first elongated bit/sense diffusion region having a longitudinal direction parallel to that of the longitudinal axis of the trench and disposed within the one sidewall of the trench, a second elongated bit/sense diffusion region having a longitudinal direction parallel to that of the longitudinal axis of the trench and disposed within the opposite sidewall of the trench, a control electrode disposed within the trench between the first storage capacitor and the first elongated bit/sense diffusion region and insulated from the sidewalls of the trench and a word line disposed on the major surface of the semiconductor substrate in contact with the control electrode. The memory may further include many additional pairs of cells disposed within the trench in a manner similar to that of the first and second cells, with each of the cells of the additional pairs of cells being connected to one of the elongated first and second bit/sense diffusion regions and with each control electrode of each additional pair of cells being connected to a respective one of many word lines arranged on the major surface of the semiconductor substrate orthogonal to the longitudinal axis of the trench.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
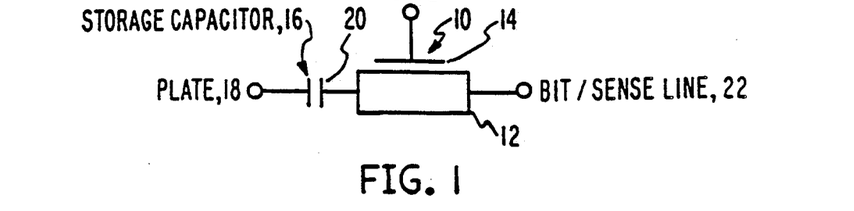
FIG. 1 is a circuit diagram of a dynamic one device memory cell indicating the principal elements thereof.

Referring to the drawings in more detail, there is shown in FIG. 1 a basic circuit diagram of a well known one device dynamic memory cell 10 which includes a field effect transistor 12 having a gate 14, a storage capacitor 16 having a conductive plate 18 and a storage node 20, and a bit/sense line 22. As is known, to store a binary digit in the storage capacitor 16, a high or low voltage is applied to the bit/sense line 22 and the transistor 12 is turned on to charge the storage node 20 if a high voltage is applied to the bit/sense line 22, indicating the presence of, say, a 1 digit, otherwise the storage node 20 remains uncharged indicating the presence of a stored 0 digit. To read information from the storage capacitor 16, the bit/sense line 22 is charged to a high voltage and the transistor 12 is turned on. If the bit/sense line 22 is discharged, a sense amplifier (not shown) connected to the bit/sense line 22 will indicate the presence of a 0 digit in the storage capacitor 16. If the bit/sense line 22 remains charged, the storage capacitor 16 is storing a 1 digit.

Figure 2:
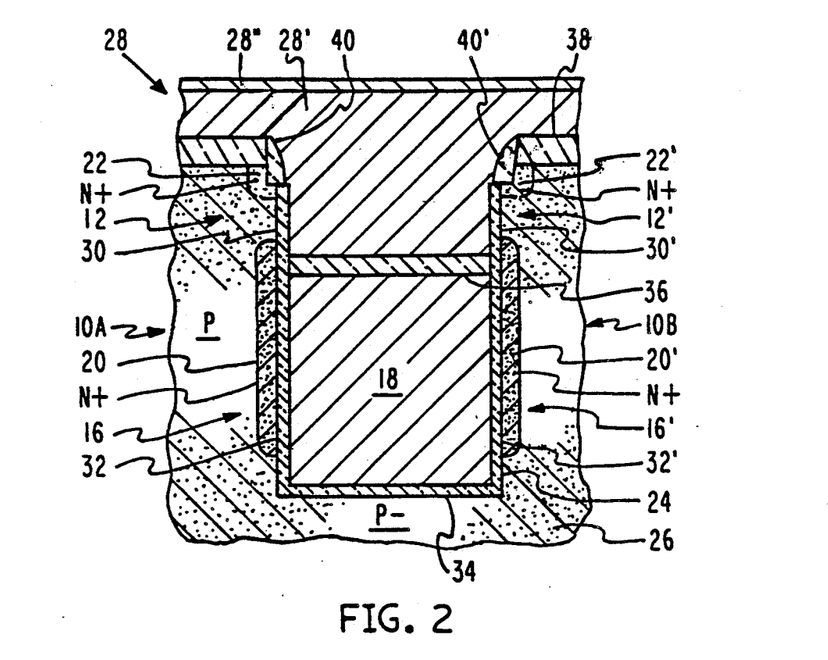
FIG. 2 is a sectional view taken through line 2-2 of FIG. 3 of two dynamic cells of the structure of the present invention.
Figure 3:
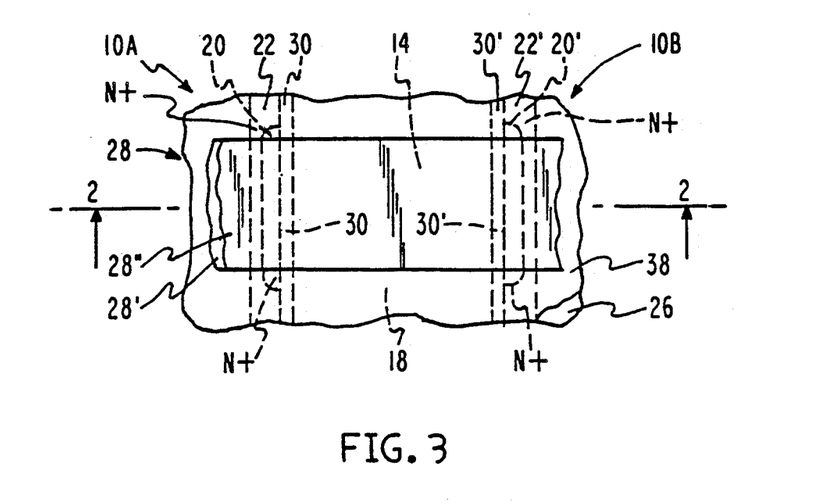
FIG. 3 is a plan view of two cells of the present invention disposed on opposite sidewalls of a trench.

In accordance with the teachings of this invention, a novel vertical structure of the memory circuit of FIG. 1 is illustrated in FIGS. 2 and 3, wherein FIG. 3 is a plan view of the structure and FIG. 2 is a sectional view taken through line 2—2 of FIG. 3. As shown in FIGS. 2 and 3, two dynamic memory cells 10A and 10B are disposed on opposite sidewalls within a trench 24 formed in a semiconductor substrate 26, preferably made of silicon and having a P- conductivity. Cell 10A includes the field effect transistor 12, the storage capacitor 16 and the bit/sense line 22, formed as an elongated N+ diffusion region within the semiconductor substrate 26 along the upper portion of a first sidewall of the trench 24. A word line 28, preferably made of doped polysilicon, tungsten silicide (WSi$_2$), or titanium silicide (TiSi$_2$), or a combination of a doped polysilicon layer 28' and a silicide layer 28'', as indicated in FIG. 2 of the drawings, or of copper-doped aluminum, is disposed at the upper or major surface of the semiconductor substrate 26 arranged orthogonally with respect to the longitudinal axis of the trench 24 in contact with the gate 14 of the transistor 12.

The transistor 12 and the capacitor 16 are located within the trench 24 on the first sidewall, with the transistor 12 being disposed between the bit/sense line 22 and the storage capacitor 16. The transistor 12 includes the gate 14, which is also preferably made of P-doped polysilicon, tungsten silicide (WSi$_2$) or titanium silicide (TiSi$_2$), or of copper-doped aluminum, separated from the first sidewall of the trench 24 by a thin insulating layer 30, preferably a triple insulating layer made of silicon dioxide, silicon nitride and silicon dioxide, or a dual layer made of silicon dioxide and silicon nitride. /If desired, the gate 14 and the word line 28 may form an integral unit, as indicated in FIG. 2 of the drawings, and made in a single process step. The storage capacitor 16 includes the storage node 20 made in the form of an N+ diffusion region disposed along the first sidewall of the trench 24 and the conductive plate 18, which may be made of P-doped polysilicon including boron, separated from the storage node or N+ diffusion region 20 by a thin insulating layer 32, preferably also a dual or triple insulating layer made of silicon dioxide and silicon nitride. The storage node or N+ diffusion region 20 acts as the source and the bit/sense line or N+ diffusion region 22 acts as the drain of the transistor 12.

A layer of insulation 34 is disposed between the bottom of the trench 24 and the conductive plate 18 to isolate the conductive plate 18 from the semiconductor substrate 26 and a layer of insulation 36 is preferably grown, to a thickness of about 1000 angstroms, as silicon dioxide on the top of the polysilcon plate 18 so as to isolate the transistor gate 14 from the polysilicon plate 18, and an insulating layer 38, preferably made of silicon dioxide, is disposed between the upper or major surface of the semiconductor substrate 26 and the word line 28, with silicon dioxide spacers 40 and 40' insulating the gate 14 from the bit/sense lines 22 and 22', respectively.

The second dynamic memory cell 10B, also located within the trench 24, has a field effect transistor 12' and a storage capacitor 16' disposed on the second or opposite sidewall of the trench 24, with the gate 14, the conductive plate 18 and the word line 28 being common to both cells 10A and 10B. The second transistor 12' includes the gate 14 separated from the second sidewall of the trench 24 by a thin insulating layer 30'. The storage capacitor 16' includes the storage node 20', made in the form of an N+ diffusion region and disposed along the second sidewall of the trench 24 within the semiconductor substrate 26, and the conductive plate 18 separated from the N+ diffusion region 20' by a thin insulating layer 32'. A bit/sense line 22', formed as an elongated N+diffusion region within the semiconductor substrate 26 along the upper portion of the second sidewall of the trench 24, serves as the drain of the field effect transistor 12', while the storage node 20' serves as the source of the transistor 12'.

As more clearly indicated in FIG. 3 of the drawings, the bit/sense lines 22 and 22' extend in a vertical direction along the longitudinal axis of the trench 24 and orthogonal to the direction of the word line 28.

It can be seen from FIGS. 2 and 3 that two very compact one device dynamic memory cells 10A and 10B are provided on opposite sidewalls of the trench 24 isolated from each other, and from any adjacent cells, wherein all elements of the two cells 10A and 10B are located within the trench 24 except for the connecting word line 28. The trench 24 may be made as deep and as wide as necessary to provide a storage capacitor of desired size and a transistor of desired switching characteristics. In one arrangement of the structure of the present invention, the depth of the trench 24 is preferably 7 microns, with a width of one micron, and the width of the channel of the transistors 12 and 12' being one micron, with the length of the channel also being equal to one micron. Each of the thin layers of insulation 30 and 30' forming the gate insulating medium of the transistors 12 and 12', respectively, has a total thickness of about 18 nanometers, with the thickness of the silicon dioxide layers each being 5 nanometers and the thickness of the silicon nitride layer being 8 nanometers when the insulating layer 30 is made in the form of the triple insulating layers. The thickness of each of the insulating or dielectric layers 32 and 32' of the storage capacitors 16 and 16' and of insulation layer 34 at the bottom of the trench 24 is preferably 13 nanometers, e.g., 4 nanometers of silicon dioxide, 7 nanometers of silicon nitride and 2 nanometers of silicon dioxide. The layers of insulation 30 and 30', 32 and 32' and 34 may also be made of the same materials and have the same thicknesses, if desired. The N+ diffusion regions 20 and 20' each extend into the substrate 26 about 150 nanometers from their respective sidewalls of the trench 24. With a spacing between adjacent cells of an array of cells along the word line direction equal to one micron or less and along the bit/sense line direction, which is orthogonal to that of the word line direction, equal to one micron or less, the size of one cell at the surface of the semiconductor substrate may be made equal to two square microns or less, which is produced when the lithographic line width is equal to one micron or less. Furthermore, the capacitance of each of the storage capacitors 16 and 16' versus the capacitance of the bit/-sense line 22, assuming 64 cells per bit/sense line, provides a very desirable transfer ratio of about 10 to 20%.

Figure 4:
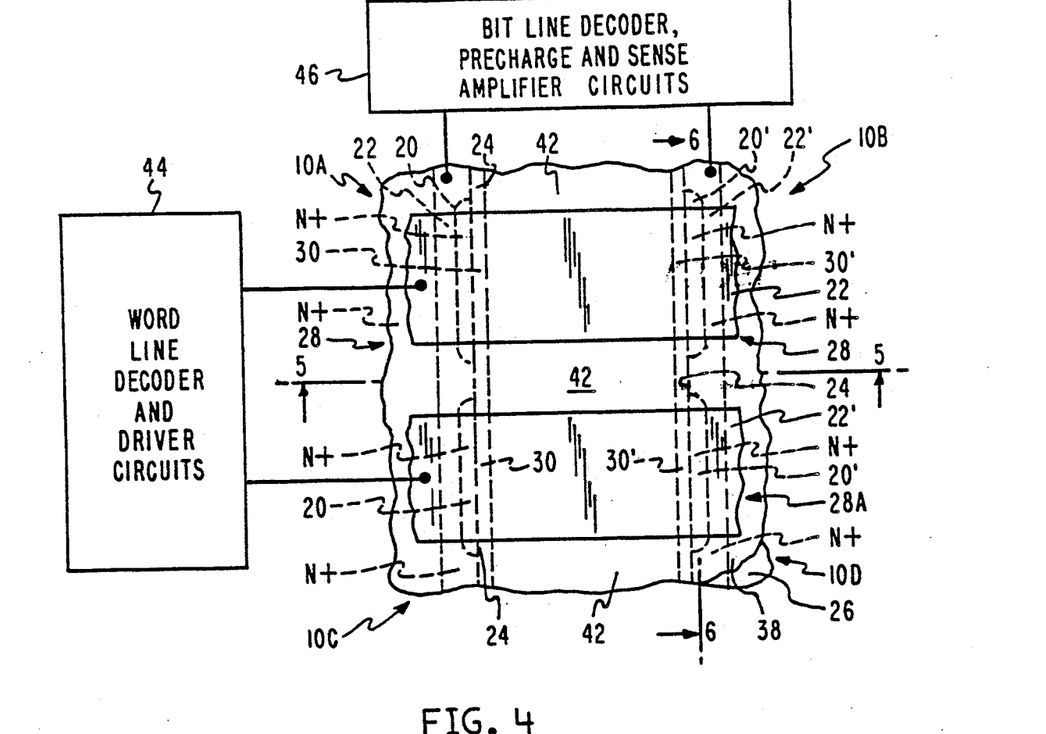
FIG. 4 is a plan view of a 2x2 array of cells, each cell being of the type illustrated in FIGS. 2 and 3, and FIGS. 5 and 6 are sectional views of the array illustrated in FIG. 4 taken through lines 5—5 and 6—6, respectively.

FIG. 4 is a plan view of an array of cells, each cell being of the type illustrated in FIGS. 2 and 3 of the drawings, wherein like reference characters refer to similar elements, with two cells 10A and 10B aligned in the horizontal direction along the first word line 28 and two cells 10C and 10D aligned in the horizontal direction along a second word line 28A. The space between the word lines of the array, such as between the word lines 28 and 28A is filled with any suitable insulating material 42, e.g., a polyimide or reflowable borophosphosilicate glass (BPSG). The cells 10A and 10C are also aligned in the vertical direction along bit/sense line 22 and the cells 10B and 10D are aligned in the vertical direction along bit/sense line 22'. As is known, each of the word lines 28 and 28A is connected to word decoder and driver circuits 44 for selective actuation and each of the bit/sense lines 22 and 22' may be connected to known bit line decoder, precharge and sense amplifier circuits 46.

Figure 5:
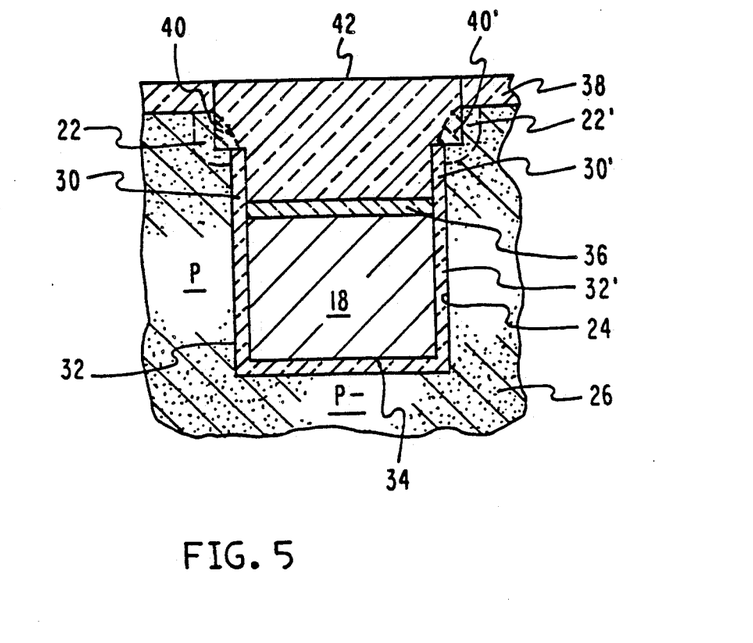
Figure 6:
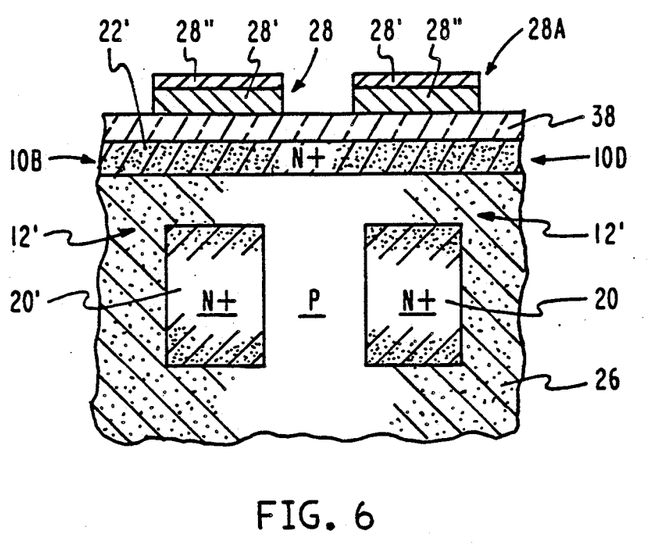

FIG. 5 is a sectional view of FIG. 4 taken through line 5—5 thereof and FIG. 6 is a sectional view of FIG. 4 taken through line 6-6 thereof to more clearly show the details of the elements of the cells 10A, 10B, 10C and 10D of the array.

By referring to FIGS. 4 and 5, wherein FIG. 5 is a sectional view taken orthogonally through the trench 24 in an isolation region between storage nodes of the cells, it can be readily seen that the bit/sense lines 22 and 22' pass through the isolation region along the upper portion of the sidewalls of the trench 24 separated by the insulating material 42 and that the N+storage nodes 20 and 20' do not exist in the isolation region. The conductive plate 18 is disposed in the isolation region at the bottom of the trench 24 insulated from the semiconductor substrate 26 by insulating layers 32, 32' and 34.

By referring to FIGS. 4 and 6 of the drawings, wherein FIG. 6 is a sectional view taken parallel to a sidewall of the trench 24 through the storage nodes 20' and the bit/sense line 22', it can be seen that the bit/-sense line 22' indicated as an elongated N+ diffusion region passes along the upper portion of the semiconductor substrate 26 over the storage node 20' of both transistors 10B and 10D but spaced therefrom, with the word lines 28 and 28A aligned over the storage node 20' of the memory cells 10B and 10D, respectively. The word lines 28 and 28A are separated from the upper or major surface of the semiconductor substrate 26 by the insulating layer 38. The sectional views of the polysilicon layer 28' and of the silicide layer 28'' of the word lines 28 and 28A may also be readily seen in FIG. 6 of the drawings. The length of the channel of transistor 12' of each of the memory cells 10B and 10D can be seen as the distance between the N+ diffusion region of the bit/sense line 22' and the N+ diffusion region or storage node 20'.

As is known, to write into or read from a random access memory array as shown in FIG. 4, word line decoder and driver circuits 44 and bit line decoder, precharge and sense amplifier circuits 46 of any known type may be used to select any one or more of the cells 10A, 10B, 10C and 10D. Furthermore, it should be understood that the trench 24 may contain hundreds of memory cells along each of the two sidewalls thereof to which the bit/sense lines 22 and 22' may be connected and that hundreds of similar spaced apart trenches may be arranged parallel to the trench 24 containing similar memory cells to which the word lines 28 and 28A may be connected. The trenches 24 may be spaced apart by one lithographic line, i.e., by as short a distance as one micron or less. Furthermore, it should be understood that in order to more effectively utilize the area of the upper or major surface of the semiconductor substrate 26, bit line decoder, precharge and sense amplifier circuits 46 may be located at one end of alternate trenches 24, while the remaining trenches 24 have the bit line decoder, precharge and sense amplifier circuits 46 disposed at the opposite end of the trenches 24. If desired, the word line decoder and driver circuits 44 may also be located at different ends of the word lines 28 and 28A in a similar manner.

Any known process may be used to make the memory cells of the present invention. In one particular process, boron ions with an energy of 10 Mev are implanted through the major surface of the semiconductor substrate 26 to produce a concentration of 1E17 to a depth of about 7 micrometers. Preferably, an epitaxial silicon layer of this thickness and doping is grown using conventional techniques. Then a shallow trench having a depth equal to about the desired width of one of the bit/sense lines 22 and 22' is etched into the semiconductor substrate 26 by known reactive ion etching techniques in a chlorine-based ambient using an oxide masking layer 38 of about 4,000 angstroms. By using known chemical vapor deposition techniques, a relatively thick oxide layer, preferably silicon dioxide, doped with about 1% arsenic and about 1500 angstroms thick, is deposited conformally along the dewalls and bottom of the shallow trench. A known reactive ion etching process is then used to form arsenic-doped oxide sidewall spacers 40 and 40', as indicated in FIGS. 2 and 5 of the drawings. Again by using reactive ion etching techniques, the shallow trench is further etched to its full depth as trench 24 illustrated in FIGS. 2 and 5 of the drawings. A thin arsenic-doped oxide layer (also about 1% arsenic doped), about 150 angstroms thick, is deposited conformally in the trench 24, followed by a reactive ion etch to remove the thin arsenic-doped layer from the upper planar surface of the substrate 26 and from the bottom of the trench 24. The trench 24 is filled with any suitable photoresist, and with the use of any known multilayer or multilevel photoresist (MLR) process, including a non-erodable layer, a deep photoresist pattern of lines is cut, by any suitable etching process, orthogonal to the longitudinal axis of the trench 24 to a depth extending to the bottom of the trench 24. This deep photoresist pattern of lines is used to define the storage nodes 20 and 20', and by subsequently etching away the exposed thin arsenic-doped oxide layer, e.g., with the use of dilute buffered hydrogen fluoride, from the sidewalls of the trench 24 within the deeply etched photoresist pattern of lines, discrete segments of arsenic-doped oxide remain on the sidewalls of the trench 24 for use in forming the storage nodes 20 and 20'. The remainder of the photoresist in which the deep photoresist pattern was formed is now removed and the trench 24 is refilled with a new photoresist and reactively ion etched uniformly down into the trench 24 to a depth desired for the upper edge of the storage nodes 20 and 20'. With the upper edge of the storage nodes 20 and 20' defined by the level of this new photoresist, all of the thin arsenic-doped oxide layer is then removed from the upper portions of the sidewalls of the trench 24 with the use of any appropriate wet etchant. Since the arsenic-doped oxide sidewall spacers 40 and 40' are much thicker than the thin arsenic-doped oxide layer, spacers 40 and 40' will remain substantially undisturbed when etching the thin arsenic-doped oxide layer. The new photoresist is then stripped or removed from the trench 24 and by using any suitable drive-in process the arsenic from the thin arsenic-doped oxide layer and from the thick sidewall spacers 40 and 40' is introduced into the semiconductor substrate 26 to form the storage nodes 20 and 20' and the bit/sense lines 22 and 22', respectively Thereafter, the thin doped oxide layer is stripped from the sidewalls of the trench 24 and the thin insulating layers 32, 32' and 34 are deposited conformally within the trench 24 by sequentially applying very thin layers of silicon dioxide, silicon nitride and silicon dioxide, with the layers 32 and 32' acting as the dielectric for the storage capacitors 16 and 16'.

The trench 24 is then filled with doped polysilicon and planarized by chemical-mechanical polishing, and the polysilicon is etched to a suitable depth within the trench 24 so as to establish the upper surface of the conductive plate 18 at a level slightly below the upper edge of the storage nodes 20 and 20', as indicated in FIG. 2 of the drawings. In order to provide an electrical contact area to the conductive plate 18, a portion of the trench 24 is masked prior to performing the last etching step. The upper surface of the conductive plate 18 is then covered with the layer of insulation 36 which may be appropriately grown on the polysilicon conductive plate 18 by any known oxidation process, increasing the thickness of the insulating layer 38 on the surface of the substrate 26.

The portions of the thin insulating layers 32 and 32' extending above the layer of insulation 36 are now removed by using any suitable wet etching process and new thin insulating layers 30 and 30' are deposited which will act as the gate dielectric of the transistors 12 and 12'. However, if desired, the extended thin insulating layers 32 and 32' may be used as the gate dielectric of the transistors 12 and 12'. The gate 14 of the transistors 12 and 12' and the word lines 28 and 28' are now made by again depositing doped polysilicon into the trench 24 and onto the upper or major surface of the semiconductor substrate 26, and then printing and etching the polysilicon into parallel strips arranged orthogonal to the longitudinal axis of the trench 24, as indicated more clearly in FIG. 2 of the drawing. If preferred, as stated hereinabove, the word lines 28 and 28A may include dual or multiple layers of conductive material so as to provide more highly conductive word lines 28 and 28A. In this instance, after the polysilicon has been deposited as polysilicon layer 28', about 4,000 angstroms thick, for the word lines 28 and 28A and prior to etching, a layer of tungsten silicide or titanium silicide, about 1,000 angstroms thick, is deposited over the polysilicon layer 28' to form a more conductive layer 28'' in the word lines 28 and 28A, as indicated in FIGS. 2 and 6 of the drawings. A polyimide or a reflowable insulating material such as borophosphosilicate glass is then used to fill the voids in the trench 24 between the word lines 28 and 28A and planarized. This latter insulating material may also be used to cover the word lines 28 and 28A with a layer about 5,000 angstroms thick. As is necessary, a first level metal layer, a passivating layer and a second level metal layer may be formed on the top of the resulting structure in the usual manner to provide appropriate electrical connections to the various elements of the memory.

It should be noted that an appropriate mask is needed after the arsenic-doped sidewall oxide spacers 40 and 40' have been formed in order to remove the doped sidewall spacers at the ends of the trench 24 to separate the bit/sense lines 22 and 22' from each other. Furthermore, another mask is needed after the arsenic-doped sidewall oxide spacers 40 and 40' have been formed to define an expanded ion implanted region electrically connected to the bit/sense lines 22 and 22' to serve as a contact area for the bit/sense lines 22 and 22' at the ends thereof. It can be readily seen in accordance with the teachings of this invention that an improved memory cell has been provided in a vertical structure within a semiconductor substrate requiring a very small cell substrate surface area, i.e., only two lithography squares by forming within a trench or groove the storage means, the switching means and the bit/sense line of the cell, with the word line disposed on the surface of the semiconductor substrate and arranged orthogonal with respect to the the longitudinal axis of the trench or bit/sense line. With the word line disposed on the surface of the semiconductor substrate, its dimensions are not subjected to the restraints placed on it as it would have were it located within a small trench, such as trench 24, and, therefore, the word line can be more readily made as a thick, highly conductive line. This arrangement is particularly important in memories since the word lines in a memory array are very long and usually significantly longer than the length of the bit/sense lines. Accordingly, it is important for high speed memories to have word lines with a resistance which is as low as possible.

Another advantage of the very dense memory of the present invention is that capacitive coupling is minimized between the bit/sense lines because the doped semiconductor substrate 26 and the word line arrangements maintain a significant shielding effect, not provided by other dense layouts, such as that shown in the hereinabove cited commonly assigned U.S. Pat. No. 4,769,786, resulting in an improved signal to noise ratio.

It can be further seen in accordance with the teachings of this invention that a high density, two square memory cell has been provided in a memory array having a highly conductive word line which uses simple, known process steps. For example, the process used does not require forming thick oxide layers deep within the small trenches, since as described hereinabove, only thin insulating layers need be formed in the lower portions of the trenches.

While the invention has been particularly shown and described with reference to preferred embodiments thereof, it will be understood by those skilled in the art that various changes in form and details may be made therein without departing from the spirit and scope of the invention.

What is claimed is:

1. A memory comprising
a semiconductor substrate having a major surface and a trench disposed therein having a longitudinal axis,
storage means disposed on a given sidewall of said trench,
switching means including an elongated current carrying element disposed within only the vicinity of the given sidewall of said trench and having a longitudinal direction parallel to that of the longitudinal axis of said trench and a control element disposed on the given sidewall of said trench between said storage means and said elongated current carrying element and coupled to said storage means, and
a first electrically conductive line disposed on said major surface of said semiconductor substrate in contact with the control element of said switching means and having a longitudinal axis arranged orthogonal to the longitudinal axis of said trench.

2. A memory as set forth in claim 1 wherein said storage means is a capacitor and said switching means is a field effect transistor.

3. A memory array comprising
a semiconductor substrate having a major surface and a trench formed therein,
first and second spaced apart storage means disposed on a first sidewall of said trench,
third and fourth spaced apart storage means disposed on a second sidewall of said trench,
first and second switching means disposed on said first sidewall between said first and second storage means, respectively, and said major surface of said substrate,
third and fourth switching means disposed on said second sidewall between said third and fourth storage means, respectively, and said major surface of said substrate,
each of said first, second, third and fourth switching means including a current carrying element and a control element,
first means disposed on the first sidewall of said trench for interconnecting the current carrying elements of said first and second switching means,
second means independent of said first means disposed on the second sidewall of said trench for interconnecting the current carrying elements of said third and fourth switching means, and
first and second electrically conductive lines disposed on the major surface of said substrate, said first conductive line being connected to the control elements of said first and third switching means and said second conductive line being connected to the control elements of said second and fourth switching means.

4. A memory array as set forth in claim 3 wherein said storage means are capacitors and said switching means are field effect transistors.

5. A memory comprising
a semiconductor substrate having a major surface and a trench disposed therein,
a first storage capacitor disposed on a first sidewall of said trench,
a first field effect transistor disposed on said first sidewall of said trench between said storage capacitor and said major surface of said substrate,
a first electrically conductive line disposed on said major surface of said substrate in contact with a control electrode of said transistor, and
a second electrically conductive line disposed within only the vicinity of the first sidewall of said trench connected to a current carrying electrode of said transistor.

6. A memory as set forth in claim 5 further including
a second storage capacitor disposed on a second sidewall of said trench, and
a second field effect transistor disposed on said second sidewall of said trench between said second storage capacitor and said major surface of said substrate,
said first electrically conductive line being in contact with a control electrode of said second transistor.

7. A memory array comprising
a semiconductor substrate having a major surface and a trench formed therein,
first and second spaced apart storage capacitors disposed on a first sidewall of said trench,
third and fourth spaced apart storage capacitor disposed on a second sidewall of said trench,
first and second field effect transistors disposed on said first sidewall between said first and second storage capacitors, respectively, and said major surface of said substrate, third and fourth field effect transistors disposed on said second sidewall between said third and fourth storage capacitors, respectively, and said major surface of said substrate, a first word line disposed on the major surface of said semiconductor substrate interconnecting gate electrodes of said first and third field effect transistors, a second word line disposed on the major surface of said semiconductor substrate interconnecting gate electrodes of said second and fourth field effect transistors, a first bit/sense line disposed within and only in the vicinity of the surface of the first sidewall of said trench interconnecting current carrying electrodes of said first and second transistors, and a second bit/sensor line disposed within and only in the vicinity of the surface of the second sidewall of said trench interconnecting current carrying electrodes of said third and fourth field effect transistors.

8. A dynamic random access memory comprising:

a semiconductor substrate having a major surface and a trench formed therein having a longitudinal axis, first and second spaced apart storage capacitors disposed along a first sidewall of said trench, a first elongated bit/sense diffusion region disposed within only the vicinity of the first sidewall of said trench in a direction parallel to the longitudinal axis of said trench, and first and second spaced apart word lines disposed on the major surface of said substrate, said first word line being arranged to control current flow between said first storage capacitor and said bit/sense diffusion region and said second word line being arranged to control current flow between said second storage capacitor and said bit/sense diffusion region.

9. A dynamic random access memory as set forth in claim 8 wherein said word lines are arranged orthogonal to the direction of said trench.

10. A dynamic random access memory as set forth in claim 9 wherein said trench has a second sidewall opposing said first sidewall and further including:

third and fourth spaced apart storage capacitors disposed along said second sidewall, and a second elongated bit/sense diffusion region disposed within only the vicinity the second sidewall of said trench in a direction parallel to the longitudinal axis of said trench, said first word line being further arranged to control the flow of current between said third storage capacitor and said second elongated bit/sense diffusion region and said second word line being further arranged to control the flow of current between said fourth storage capacitor and said second elongated bit/sense diffusion region.

11. A dynamic random access memory as set forth in claim 8 wherein each of said storage capacitors includes a diffusion region disposed in said first sidewall and a conductive plate disposed within said trench insulated from said diffusion regions.

12. A dynamic random access memory as set forth in claim 11 further including an insulation layer disposed on said conductive plate between said word lines and said conductive plate.

13. A dynamic random access memory as set forth in claim 11 wherein said conductive plate and said word lines are made of doped polysilicon.

14. A dynamic random access memory as set forth in claim 13 wherein said word lines further include a silicide.

15. A dynamic random access memory as set forth in claim 10 wherein each of said storage capacitors includes a diffusion region disposed in one of said first and second sidewalls and a conductive plate disposed within said trench insulated from said diffusion regions.

16. A dynamic random access memory as set forth in claim 15 further including an insulation layer disposed on said conductive plate between said word lines and said conductive plate.

17. A dynamic random access memory as set forth in claim 15 wherein said conductive plate and said word lines are made of doped polysilicon, and further including an insulating medium disposed between said first and second word lines.

18. A dynamic random access memory as set forth in claim 17 wherein said insulating medium is polyimide.

19. A dynamic random access memory comprising a semiconductor substrate having a major surface and a trench disposed therein having a longitudinal axis and first and second sidewalls, first and second storage means, said first storage means being disposed on a lower portion of said first sidewall and said second storage means being disposed on a lower portion of said second sidewall, each of said storage mans including a storage node disposed within said semiconductor substrate, first and second switching means disposed on the first and second sidewalls, respectively, of said trench, each of said switching means having an elongated diffusion region and a control electrode, the elongated diffusion region of said first switching means being disposed at an upper portion of the first sidewall, and only in the vicinity thereof, in a direction parallel to that of the longitudinal axis of said trench and the control electrode of said first switching means being disposed between the diffusion region of said first switching means and the first storage means, the elongated diffusion region of said second switching means being disposed at an upper portion of the second sidewall, and only in the vicinity thereof, in a direction parallel to that of the longitudinal axis of said trench and the control electrode of said second switching means being disposed between the diffusion region of said second switching means and said second storage means, and a conductive line disposed on the major surface of said semiconductor substrate in contact with the control electrodes of said first and second switching means.

20. A memory comprising a semiconductor substrate having a major surface and a trench disposed therein having a longitudinal axis, first and second storage means disposed on a first sidewall of said trench, first and second switching means, each having a control element and an elongated current carrying element, disposed on said first sidewall of said trench between said first and second storage means, respectively, and said major surface of said substrate and coupled to said respective storage means, said elongated current carrying elements being interconnected, disposed within only the vicinity of said first sidewall and arranged parallel to the longitudinal axis of said trench, and first and second electrically conductive lines disposed on said major surface of said semiconductor substrate, each having a longitudinal axis arranged orthogonal to the longitudinal axis of said trench, said first electrically conductive line being in contact with the control element of said first switching means and said second electrically conductive line being in contact with the control element of said second switching means.

21. A memory as set forth in claim 20 wherein said trench has a second sidewall opposing said first sidewall and further including:

third and fourth storage means disposed on said second sidewall, third and fourth switching means, each having a control element and a current carrying element, disposed on said second sidewall, said first electrically conductive line being connected to the control element of said third switching means and said second electrically conductive line being connected to the control element of said fourth switching means.

22. A memory as set forth in claim 21 wherein each of said storage means is a capacitor having a diffusion region in said substrate and a conductive plate insulated from said sidewalls.

23. A memory as set forth in claim 22 wherein said conductive plate and said first and second conductive lines include doped polysilicon.

24. A plurality of circuit structures formed on a substrate disposed in a spaced relationship within an elongated trench having first and second major sidewalls and a bottom comprising a plurality of set of first and second discrete storage means disposed in a spaced relationship in lower portions of the trench, each of the sets comprising first and second storage nodes formed along lower portions of the first and second major sidewalls, respectively, and a first conductor disposed within the lower portion of the trench, said first conductor interconnecting all of the sets in a given trench, and a plurality of sets of first and second discrete switching means disposed in a spaced relationship within upper portions of the trench, the first and second discrete switching means of each set being coupled to respective ones of the first and second discrete storage means, each of the sets of first and second discrete switching means comprising first and second elongated diffused rails having axes arranged parallel to the longitudinal axis of said trench and formed along upper portions of the first and second major sidewalls, respectively, and only in the vicinity thereof, spaced from the first and second storage nodes, and a second conductor arranged as a control gate disposed within the upper portion of the trench, the second conductor of each set being isolated from the first conductor and being isolated from the second conductor of adjacent sets.

* * * * *